United States Patent
Miyachi et al.

(10) Patent No.: US 7,171,186 B2
(45) Date of Patent: Jan. 30, 2007

(54) CELLULAR MOBILE PHONE WITH USER-DATA BACKUP AND AVAILABLE TIME DISPLAY FUNCTIONALITY

(75) Inventors: Ryoko Miyachi, Osaka (JP); Tsutomu Mikami, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 413 days.

(21) Appl. No.: 10/617,773

(22) Filed: Jul. 14, 2003

(65) Prior Publication Data

US 2004/0014489 A1 Jan. 22, 2004

(30) Foreign Application Priority Data

Jul. 22, 2002 (JP) .............................. 2002-212441

(51) Int. Cl.
*H04B 1/16* (2006.01)
(52) U.S. Cl. ................... 455/343.5; 455/343.2; 455/343.4; 455/574; 320/134; 320/136; 379/433.08; 379/413
(58) Field of Classification Search ............... 455/574, 455/573, 550.1, 575.1, 424, 572, 425, 456.5, 455/456.6, 561, 566.1, 423, 67.11, 566, 333, 455/334, 343.2, 343.1, 343.5, 343.3, 569.1, 455/127.5; 324/427, 428, 426, 429, 430; 320/134, 136, 162, 127, 132, 133, 106, 48, 320/149; 711/162; 379/90.01, 93.08, 93.05, 379/93.06, 93.15, 93.28, 428, 433, 433.08, 379/324, 413
See application file for complete search history.

(56) References Cited

U.S. PATENT DOCUMENTS

| | | | | |
|---|---|---|---|---|
| 5,455,499 A * | 10/1995 | Uskali et al. ............ 340/636.1 |
| 5,739,674 A * | 4/1998 | Kawahara et al. .......... 320/106 |
| 6,078,791 A * | 6/2000 | Tuttle et al. ................ 455/90.1 |
| 6,127,933 A | 10/2000 | Ohmura et al. |
| 6,157,169 A | 12/2000 | Lee |
| 6,201,372 B1 * | 3/2001 | Green et al. ................. 320/132 |
| 6,236,214 B1 * | 5/2001 | Camp et al. ................. 324/427 |
| 6,313,832 B1 * | 11/2001 | Ishida ......................... 345/211 |
| 6,384,578 B1 * | 5/2002 | Patino et al. ................ 320/149 |
| 6,484,110 B1 * | 11/2002 | Jung ............................. 702/63 |
| 6,501,949 B1 * | 12/2002 | Singleton ................. 455/422.1 |
| 6,693,996 B2 * | 2/2004 | Mansfield ................ 379/90.01 |
| 6,710,578 B1 * | 3/2004 | Sklovsky ..................... 320/127 |

(Continued)

FOREIGN PATENT DOCUMENTS

CN 1220565 A 6/1999

(Continued)

*Primary Examiner*—Edward F. Urban
*Assistant Examiner*—Charles Chow
(74) *Attorney, Agent, or Firm*—McDermott Will Emery LLP (57) ABSTRACT

Data which indicates remaining capacity of a battery in terms of the terminal voltage of the battery is updated by a control unit when necessary, whereby available capacity of the battery is accurately calculated regardless of the extent of deterioration of the battery. In addition to the battery's calculated available capacity, a radio-wave receiving condition and a temperature detected by a temperature detection unit are also taken into consideration to accurately calculate and display an available time. Moreover, the control unit performs the entire process of backing up user data into a non-volatile internal memory (flash memory), which reduces power consumption required for the backup process, resulting in a longer available time.

6 Claims, 12 Drawing Sheets

U.S. PATENT DOCUMENTS

| | | | |
|---|---|---|---|
| 6,785,786 B1* | 8/2004 | Gold et al. | 711/162 |
| 2001/0008424 A1* | 7/2001 | Higuchi et al. | 348/372 |
| 2002/0093312 A1* | 7/2002 | Choo | 320/149 |
| 2003/0023673 A1* | 1/2003 | Tso | 709/203 |
| 2004/0104706 A1* | 6/2004 | Ooi et al. | 320/132 |

FOREIGN PATENT DOCUMENTS

| | | |
|---|---|---|
| CN | 1228540 A | 9/1999 |
| JP | 11-55372 | 2/1999 |
| JP | P2000-78070 A | 3/2000 |

* cited by examiner

| Terminal voltage V | Threshold voltage Voff | .... | V(n) | V(n-1) | .... | V(1) | V(0) |
|---|---|---|---|---|---|---|---|
| Remaining capacity Q | Threshold remaining capacity Qoff | .... | Q(n) | Q(n-1) | .... | Q(1) | Q(0) |

FIG. 7

| Mode \ Wave intensity | High | Medium | Low |
|---|---|---|---|
| Standby | Iwait1 | Iwait2 | Iwait3 |
| Talk | Italk1 | Italk2 | Italk3 |
| Mail receiving | Imailget1 | Imailget2 | Imailget3 |
| Mail sending | Imailsend1 | Imailsend2 | Imailsend3 |
| Internet connection | Inet1 | Inet2 | Inet3 |
| Backup (internal memory) | Ibackup_in | Ibackup_in | Ibackup_in |
| Backup (home memory) | Ibackup_hm1 | Ibackup_hm2 | Ibackup_hm3 |
| Backup (other external memory) | Ibackup_out | Ibackup_out | Ibackup_out |

CELLULAR MOBILE PHONE WITH USER-DATA BACKUP AND AVAILABLE TIME DISPLAY FUNCTIONALITY

BACKGROUND OF THE INVENTION

The present invention relates to available-time display and user-data backup in a battery-driven cellular mobile phone.

Japanese Laid-Open Publication No. 11-55372 discloses a technique in which in a portable phone, data on available time (available talk time and standby time) in terms of the terminal voltage of the battery is stored beforehand in a ROM, and the portable phone's available time corresponding to the remaining capacity of the battery is obtained for display from the measured value of the battery's terminal voltage. This technique improves the usability of the phone as compared with a case in which the remaining capacity of a battery in terms of its fully charged state is displayed in several levels in accordance with the terminal voltage of the battery.

In cellular phones, user data such as communication parameters, voice notes, a phone book and mail data is generated. Such user data is temporarily recorded in DRAMs, SRAMs or other volatile memory and then is backed up into a flash memory or other non-volatile memory.

Japanese Laid-Open Publication No. 2000-78070 discloses a technique in which backup of user data generated in a mobile phone is transferred to and stored in a memory backup center (for example, a radio base station) on a mobile communication network. According to this technique, as long as backup of the user data is made on a regular basis, even if the mobile phone has been lost, necessary data can be obtained from the network by another cellular phone, which therefore improves the ease of use.

Nevertheless, since the conventional available-time display technique uses the data stored in advance in the ROM, if characteristics of the battery have changed due to deterioration of the battery or changes in the battery temperature, an accurate available time cannot be obtained.

Further, if the above-described user-data backup operation is frequently performed, the battery becomes exhausted needlessly. Suppose for example a case in which the backup destination is a flash memory. Since the flash memory permits writing only in block units, even if the data that needs to be rewritten is just a single byte, it could only be written into the memory in units of, e.g., several dozen bytes, meaning that power for writing several dozen bytes' worth of data would be used up. Therefore, if a backup is made and stored into the flash memory each time new user data is registered, the battery would be consumed significantly, which would result in a shorter available time.

SUMMARY OF THE INVENTION

A first object of the present invention is therefore to accurately calculate and then display an available time for a cellular mobile phone.

A second object of the present invention is that in a cellular mobile phone, the consumption of the battery due to user-data backup operation is controlled to achieve a longer available time.

To achieve the first object, an inventive cellular mobile phone includes a control unit for calculating available time for the cellular mobile phone while updating, when necessary, data that indicates remaining capacity of the battery in terms of the terminal voltage of the battery and a display unit for displaying thereon the calculated available time. Then, a deterioration condition in the battery is always reflected in the data that indicates the remaining capacity of the battery, as a result of which accuracy in the available-time calculation improves. The inventive cellular mobile phone may further include a temperature detection unit for detecting temperature near the battery. The control unit may also function to correct the data that indicates the remaining capacity in accordance with the detected temperature. Further, in the inventive cellular mobile phone, the control unit may also have the function of calculating the available time for the cellular mobile phone based on the magnitude of the battery's current which is required in accordance with a radio-wave receiving condition in the cellular mobile phone.

Another inventive cellular mobile phone includes: a control unit for measuring the terminal voltage and current of the battery, a transmit/receive unit for providing an external device with notification of the measured terminal voltage and current, and receiving notification of available time for the cellular mobile phone, wherein the external device has calculated the available time while updating, when necessary, data which indicates remaining capacity of the battery in terms of the terminal voltage of the battery, and a display unit for displaying thereon the notified available time. This allows a deterioration condition in the battery to be always reflected in the data that indicates the remaining capacity of the battery, which results in improved accuracy in the available-time calculation. In addition, since the external device performs the available-time calculations, electric power consumed by the cellular mobile phone itself is reduced. The inventive cellular mobile phone may further includes a temperature detection unit for detecting temperature near the battery. The transmit/receive unit may also function to notify the external device of the detected temperature so that the data that indicates the remaining capacity is corrected by the external device in accordance with the detected temperature. Furthermore, in the inventive cellular mobile phone, the transmit/receive unit may also function to notify the external device of a radio-wave receiving condition in the cellular mobile phone so that the available time for the cellular mobile phone is calculated by the external device based on the magnitude of the battery's current which is required in accordance with the radio-wave receiving condition in the cellular mobile phone.

To achieve the second object, still another inventive cellular mobile phone includes a control unit for exercising control in order to reduce, in accordance with the magnitude of remaining available capacity of the battery, the number of times a process for making a backup of user data is performed. In the inventive cellular mobile phone, the reduced frequency of the user-data backup operation controls the battery consumption, which results in a longer available time. In the inventive cellular mobile phone, the control unit may function to delay the backup process if the remaining available capacity of the battery is sufficiently larger than necessary capacity for the backup process. This allows the user-data backup process to be performed in a collective manner, thereby suppressing the battery consumption. The inventive cellular mobile phone may be structured in such a manner that a memory in which the backup of the user data is stored may be selected from among an internal memory of the cellular mobile phone, a home memory for managing subscriber information, and an external memory other than the home memory. This further improves the usability of the cellular phone. In the inventive cellular mobile phone, the control unit may also function to find and delete unnecessary data in the user data if remaining capacity of a memory in which the backup of the user data is to be stored is insufficient. Then, it is possible avoid situations in which the backup operation cannot be performed because of the insufficient remaining capacity of the memory, causing the necessary data to be lost.

DESCRIPTION OF THE PREFERRED EMBODIMENTS

Hereinafter, an embodiment of the present invention will be described in detail with reference to the accompanying drawings.

Figure 1:
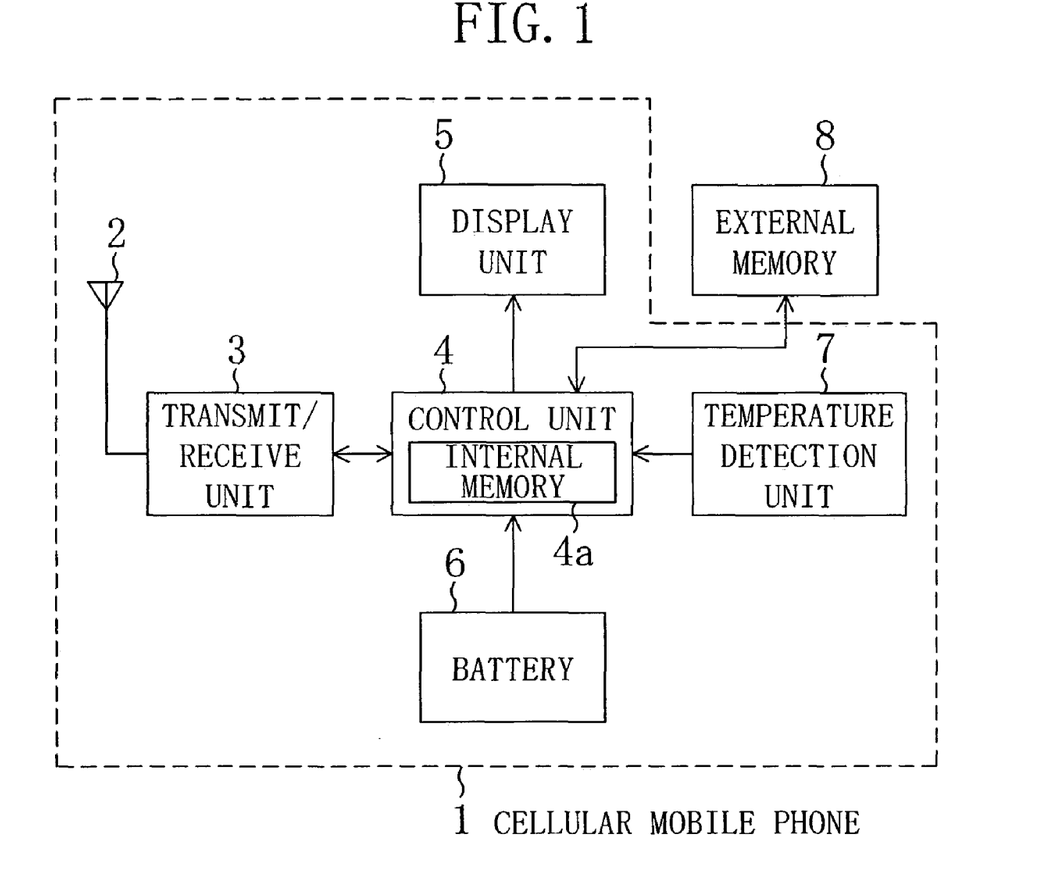
FIG. 1 is a block diagram illustrating an exemplary configuration of a cellular mobile phone in accordance with the present invention.

FIG. 1 illustrates an exemplary configuration of a cellular mobile phone in accordance with the present invention. The cellular mobile phone 1 shown in FIG. 1 includes an antenna 2, a transmit/receive unit 3, a control unit 4, a display unit 5, a battery 6, and a temperature detection unit 7. The transmit/receive unit 3 modulates a signal outputted from the control unit 4 to send the modulated signal via the antenna 2, while demodulating a signal inputted from the antenna 2 to supply the demodulated signal to the control unit 4. The control unit 4 controls standby and talk modes, and also calculates an available time for the cellular mobile phone 1 and performs a user-data backup process. The control unit 4 includes a non-volatile internal memory 4a in addition to a volatile memory in which user data is temporarily recorded. The non-volatile internal memory 4a is a memory in which a backup of the user data may be stored, and may be a flash memory, for example. The display unit 5 displays information such as a telephone number which is inputted from the control unit 4, and also displays the available time calculated by the control unit 4. The battery 6 supplies power for the entire cellular mobile phone 1. The temperature detection unit 7 detects temperature near the battery 6 and supplies the control unit 4 with a signal that indicates the detected temperature. Further, a non-volatile external memory 8 is removably connected to the control unit 4. The external memory 8 serves as another memory in which the backup of the user data may be stored. The transmit/receive unit 3 and the control unit 4 are mounted on a single semiconductor integrated circuit chip.

Figure 2:
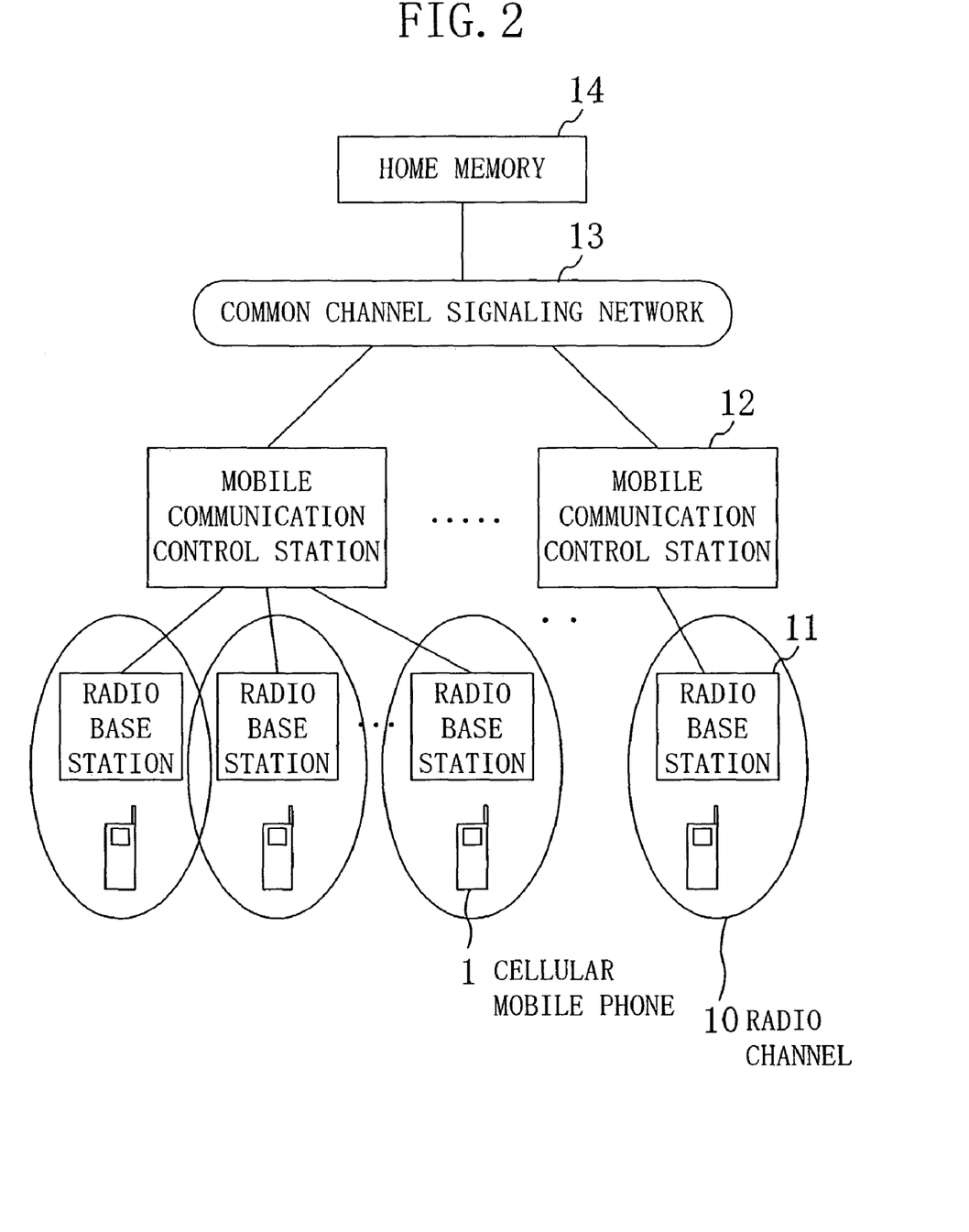
FIG. 2 is a conceptual diagram of a mobile communication network in which the cellular mobile phone shown in FIG. 1 is used.

FIG. 2 is a conceptual diagram of a mobile communication network in which the cellular mobile phone 1 shown in FIG. 1 is used. In FIG. 2, the reference numerals 10 and 11 denote radio channels and radio base stations, respectively. The reference numeral 12 denotes mobile communication control stations, which control the radio base stations 11. The reference numeral 13 denotes a common channel signaling network, which connects the mobile communication control stations 12 with each other. The reference numeral 14 denotes a home memory, which manages information on numerous cellular-phone subscribers. The home memory 14 can be used by the subscribers taking along the cellular mobile phone 1 even as they move from area to area covered by any of the radio base stations 11, and functions as still another memory in which the user-data backup may be stored.

The battery 6 shown in FIG. 1 has a threshold voltage Voff upon which whether the battery 6 is usable or not depends. At the point in time that the terminal voltage V of the battery 6 becomes the threshold voltage Voff, there is slight capacity left in the battery 6.

However, once the terminal voltage V of the battery 6 has dropped below the threshold voltage Voff, the terminal voltage V decreases rapidly and sharply, which may cause overdischarge; therefore such capacity cannot be used. Specifically, when the terminal voltage V of the battery 6 reaches the threshold voltage Voff, the battery 6 is no longer able to supply voltage, which means that the capacity of the battery 6 that has been used until the terminal voltage V of the battery 6 reaches the threshold voltage Voff is the available capacity thereof The available capacity of the battery 6 normally changes due to its deterioration and temperature changes.

Figure 3:
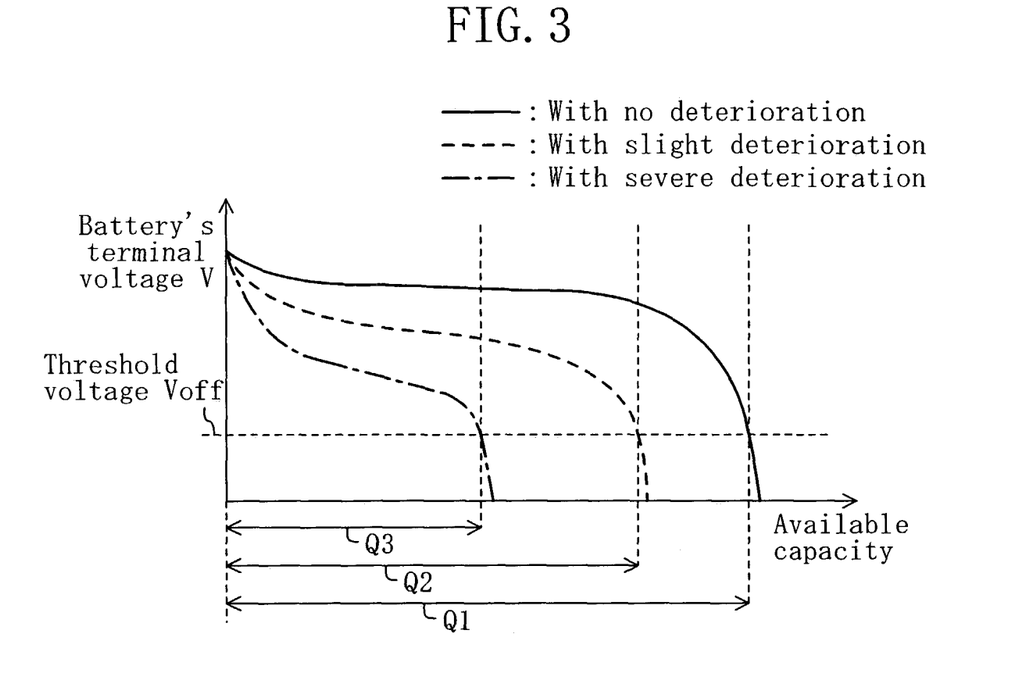
FIG. 3 shows an example of changes in characteristics of a battery shown in FIG. 1 which are attributable to its deterioration.

FIG. 3 shows an example of changes in characteristics of the battery 6 which are attributable to its deterioration. The solid line indicates terminal-voltage and available-capacity characteristics when no deterioration occurs, in which case the available capacity is Q1. The broken line indicates the characteristics when slight deterioration occurs, and the available capacity in this case is Q2. The alternate long and short dash line indicates the characteristics when severe deterioration occurs, and the available capacity in this case is Q3. In the graph, Q1>Q2>Q3, which indicates that the available capacity of the battery 6 decreases as the battery 6 deteriorates.

Figure 4:
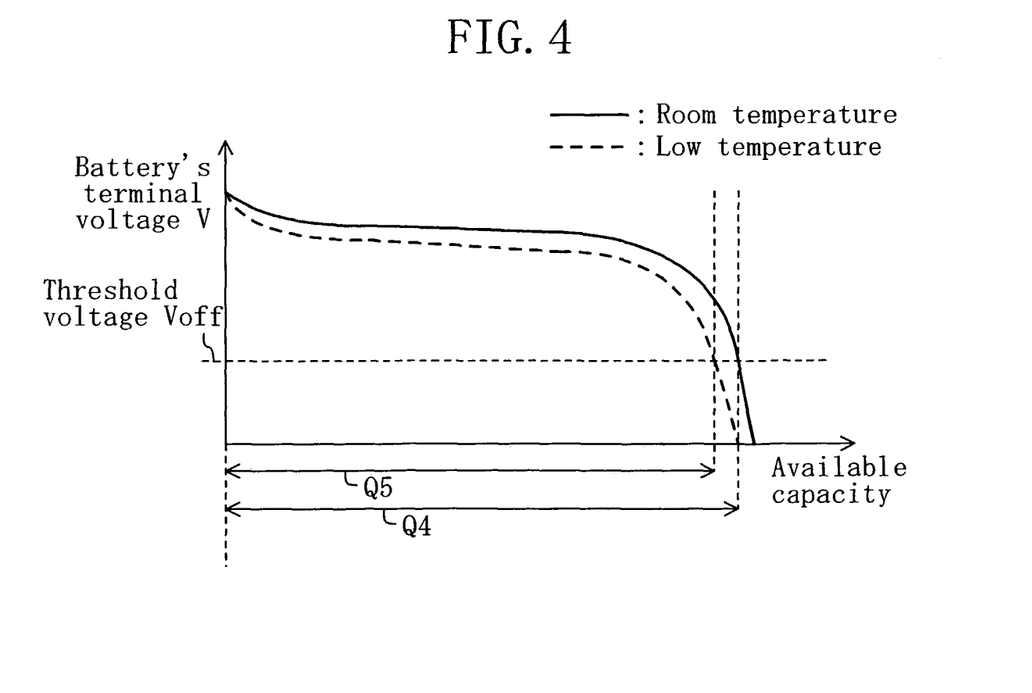
FIG. 4 shows an example of changes in characteristics of the battery shown in FIG. 1 caused by temperature changes.

FIG. 4 shows an example of changes in characteristics of the battery 6 caused by temperature changes. The solid line indicates terminal-voltage and available-capacity characteristics at room temperatures, in which case the available capacity is Q4. The broken line indicates the characteristics at a low temperature, in which case the available capacity is Q5. In the graph, Q4>Q5, from which it is found that the available capacity of the battery 6 at a low temperature is smaller that that at room temperatures.

Hereinafter, available-time display and user-data backup in the portable cellular phone 1 shown in FIG. 1 will be sequentially described in detail. It should be noted that a suitable one of the internal memory 4a, external memory 8, and home memory 14 can be selected as a memory in which backup of user data is stored.

Figure 5:
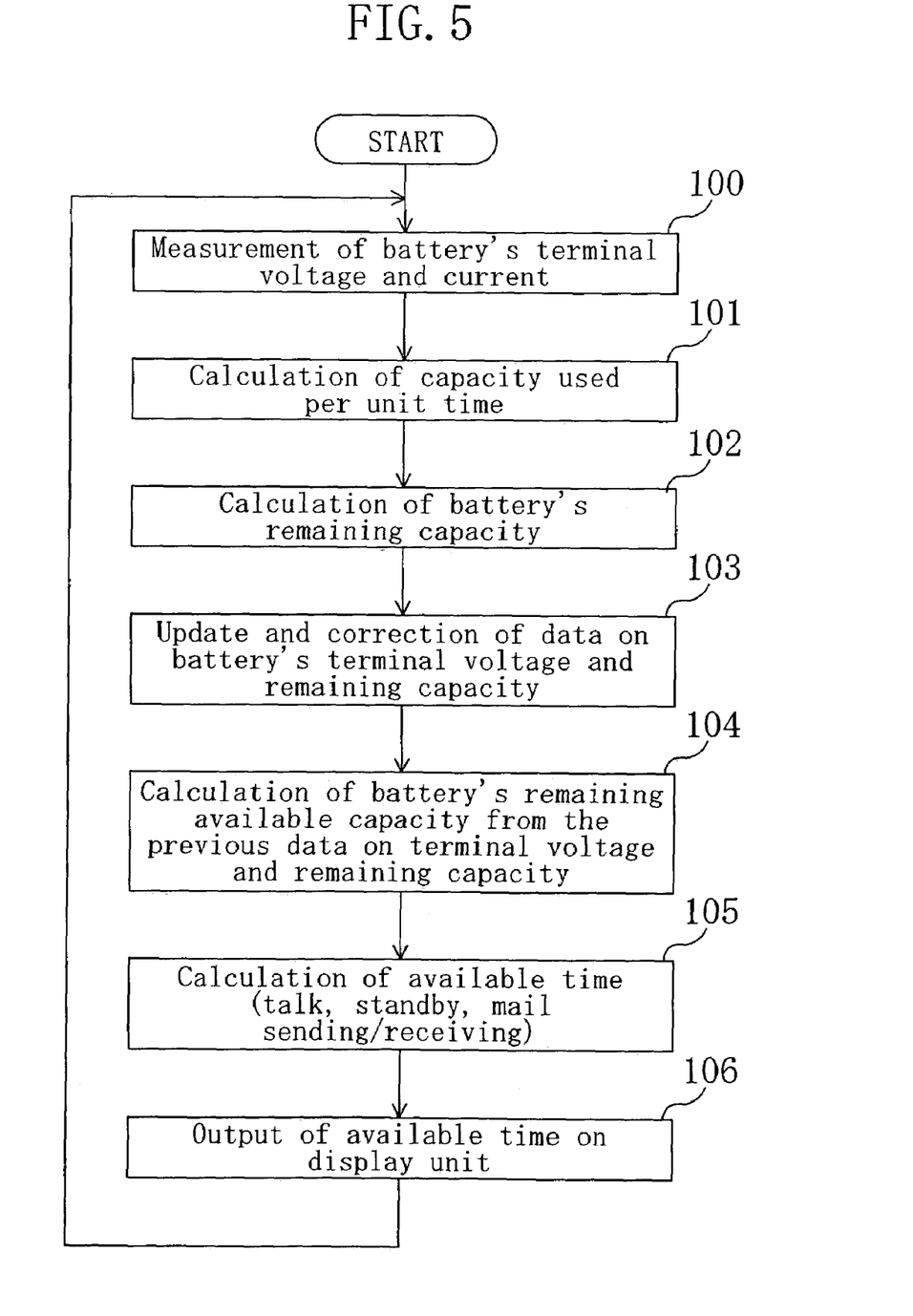
FIG. 5 is a flow chart illustrating process steps performed in a control unit when an available time is calculated in the cellular mobile phone shown in FIG. 1.
Figure 6:
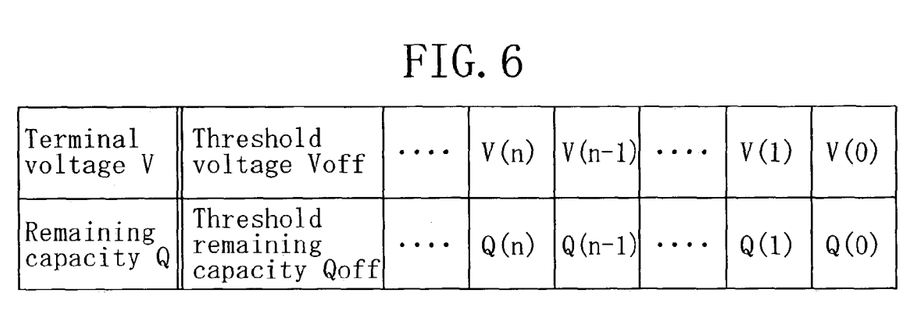
FIG. 6 is a view showing results from the step, shown in FIG. 5, of updating/correcting data which indicates the battery's terminal voltage and remaining capacity.

FIG. 5 is a flow chart illustrating process steps performed in the control unit 4 when an available time is calculated in the cellular mobile phone 1 shown in FIG. 1. The reference numeral 100 in FIG. 5 denotes the step of measuring the terminal voltage V(n) and current I(n) of the battery 6. The reference numeral 101 denotes the step of calculating capacity $\Delta Q(n)(=I(n) \times t)$ used per unit time t. The unit time t is an amount of time necessary to return to Step 100. The reference numeral 102 denotes the step of calculating remaining capacity $Q(n)(=Q(n-1)-\Delta Q(n))$ of the battery 6. The reference numeral 103 denotes the step of updating data which indicates the remaining capacity Q of the battery 6 in terms of the terminal voltage V of the battery 6, and correcting the data using the rate k of change of voltage in the battery 6 in accordance with a temperature detected by the temperature detector 7 (see FIG. 4). FIG. 6 shows results of Step 103. In FIG. 6, V(0) and Q(0) represent initial values immediately after the battery 6 has been charged.

Figure 7:
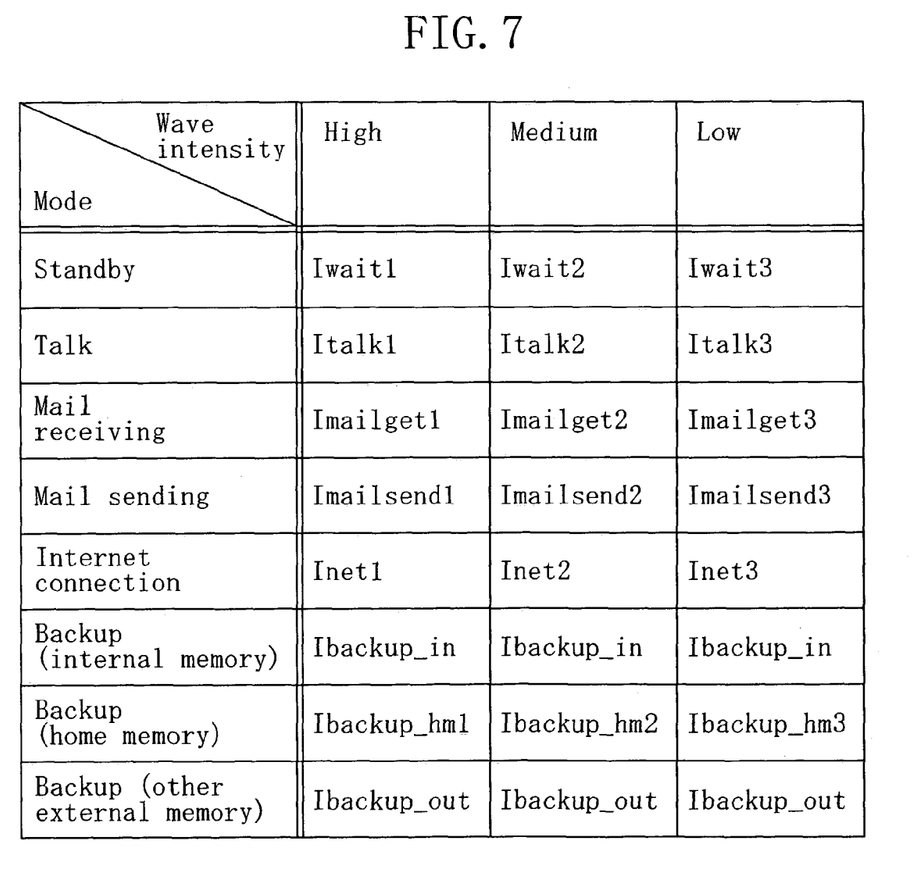
FIG. 7 shows a current table which is referred to in an available-time calculation step shown in FIG. 5.

The reference numeral 104 in FIG. 5 denotes the step of calculating remaining available capacity Q*(n)(=Q(n)-Qoff) of the battery 6. In this step, the remaining available capacity Q*(n) is calculated by obtaining threshold remaining capacity Qoff of the battery 6 in terms of the threshold voltage Voff, at which the battery 6 becomes unusable, from the previously recorded data that indicates the remaining capacity Q of the battery 6 in terms of the terminal voltage V of the battery 6 and that has been corrected in consideration of the temperature. The reference numeral 105 indicates the step of calculating an available time T(n)(=Q*(n)/I). In this step, necessary current I is obtained based on the display mode (standby, talking, mail-receiving, mail-sending, Internet-connection, or other mode) and the radio-wave receiving condition at the time of the calculation. FIG. 7 shows a current table which is referred to in Step 105. Backup modes shown in FIG. 7 will be described later.

The reference numeral 106 in FIG. 5 denotes the step of outputting the available time T(n) to the display portion 5. Thereafter, the operations in Steps 100 through 106 are repeated.

As described above, in accordance with the process steps shown in FIG. 5, the data that indicates the remaining capacity Q of the battery 6 in terms of the terminal voltage V of the battery 6 in the cellular mobile phone 1 is updated when necessary, which allows the cellular phone 1 to accurately calculate and display the available time T(n).

The radio base station 11 shown in FIG. 2, instead of the cellular mobile phone 1 shown in FIG. 1, can also perform the above-described available-time calculation process.

Figure 8:
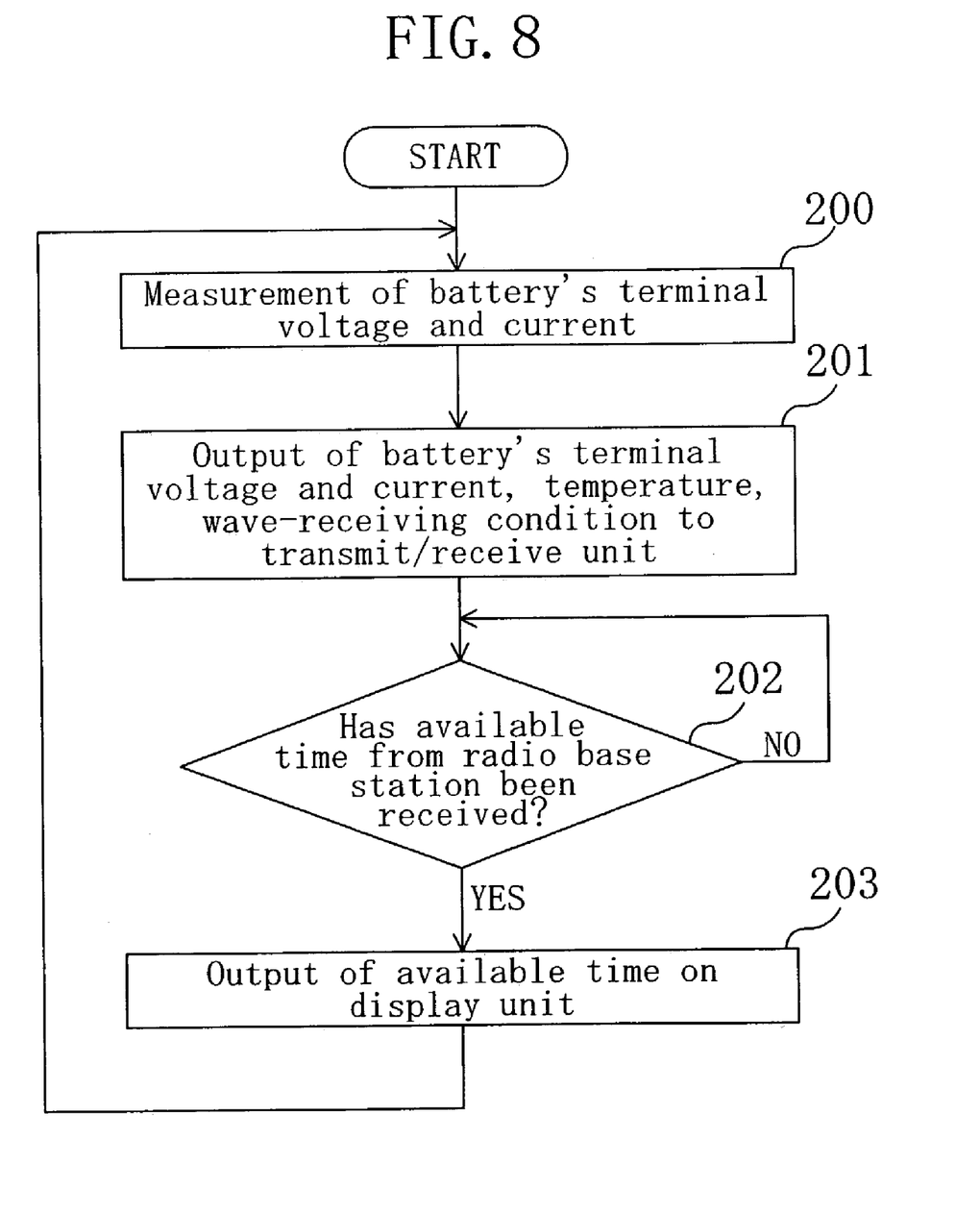
FIG. 8 is a flow chart illustrating process steps performed in the control unit of the cellular mobile phone when a radio base station shown in FIG. 2 carries out available-time calculations.

FIG. 8 is a flow chart illustrating process steps performed in the control unit 4 of the cellular mobile phone 1 when the radio base station 11 shown in FIG. 2 carries out available-time calculations. The reference numeral 200 in FIG. 8 indicates the step of measuring the terminal voltage V(n) and current I(n) of the battery 6. The reference numeral 201 denotes a step in which the measured terminal voltage V(n) and current I(n) of the battery 6, a temperature detected by the temperature detecting portion 7, and the radio-wave receiving condition in the mobile phone 1 are outputted to the transmitter-receiver 3, thereby providing notification thereof to the radio base station 11. The reference numeral 202 denotes the step of determining whether the transmitter-receiver 3 has received an available time T(n) calculated by the radio base station 11. The reference numeral 203 denotes the step of outputting the available time T(n) to the display unit 5 in the case where it has been determined in Step 202 that the available time T(n) has been received. Thereafter, the operations in Steps 200 through 203 are repeated.

Figure 9:
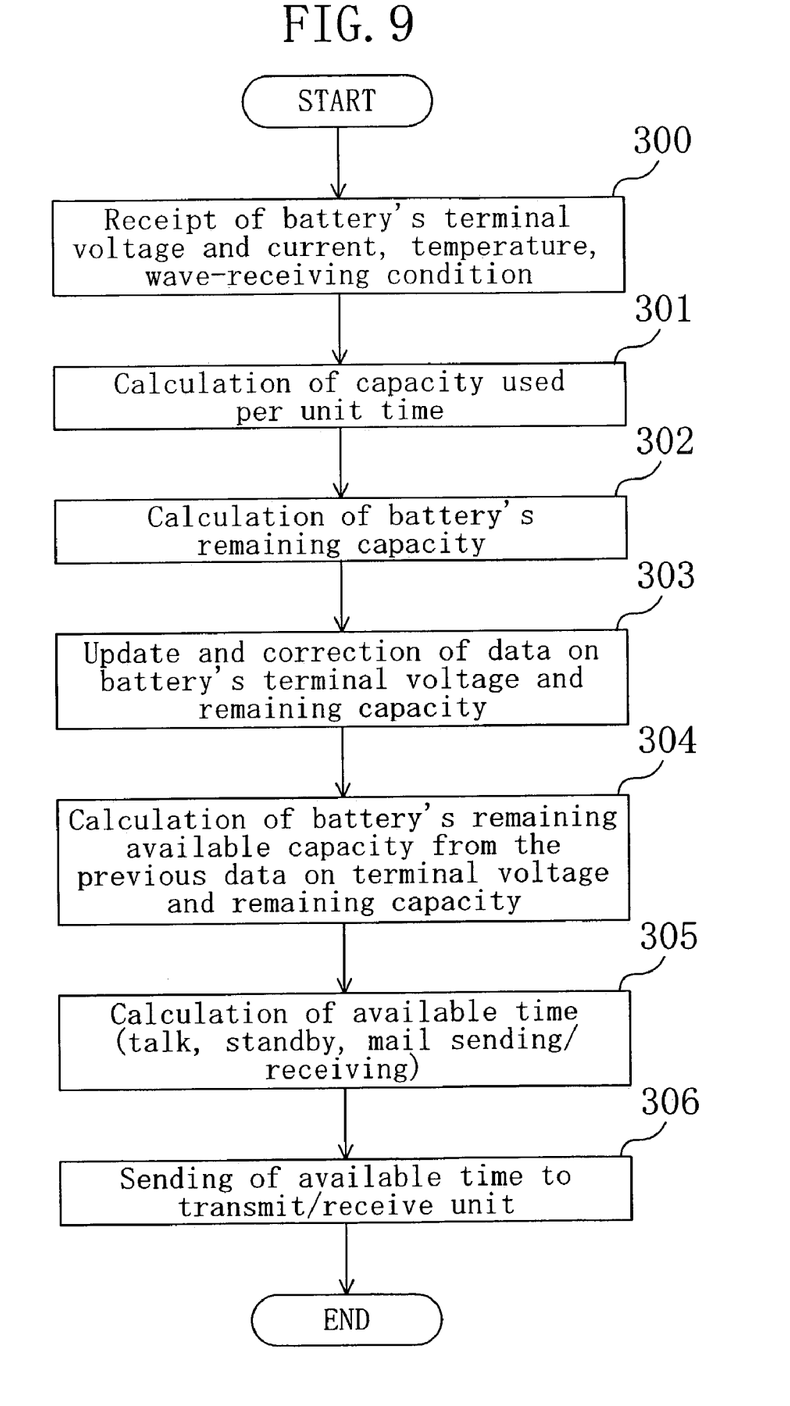
FIG. 9 is a flow chart illustrating process steps carried out in the radio base station shown in FIG. 2 when the radio base station carries out the available-time calculations.

FIG. 9 is a flow chart illustrating process steps carried out in the radio base station 11 shown in FIG. 2 when the radio base station 11 performs the available-time calculations. The reference numeral 300 in FIG. 9 denotes the step of receiving the information, that is, the terminal voltage V(n) and current I(n) of the battery 6, the temperature detected by the temperature detection unit 7 and the radio-wave receiving condition in the cellular mobile phone 1., transferred by the cellular mobile phone 1. The reference numerals 301 through 305 indicate steps which correspond to Steps 101 through 105 shown in FIG. 5. It should be however noted that data that indicates the remaining capacity Q of the battery 6 in terms of the terminal voltage V of the battery 6 is recorded in the home memory 14. The reference numeral 306 denotes the step of transmitting the available time T(n) to the transmit/receive unit 3 of the cellular mobile phone 1.

As described above, in the process steps shown in FIGS. 8 and 9, the data recorded in the home memory 14 and indicating the remaining capacity Q of the battery 6 in terms of the terminal voltage V of the battery 6 is updated as needed, such that the radio base station 11 can calculate the available time T(n) accurately and display the calculated available time T(n) on the display 5 of the handheld phone 1.

Figure 10:
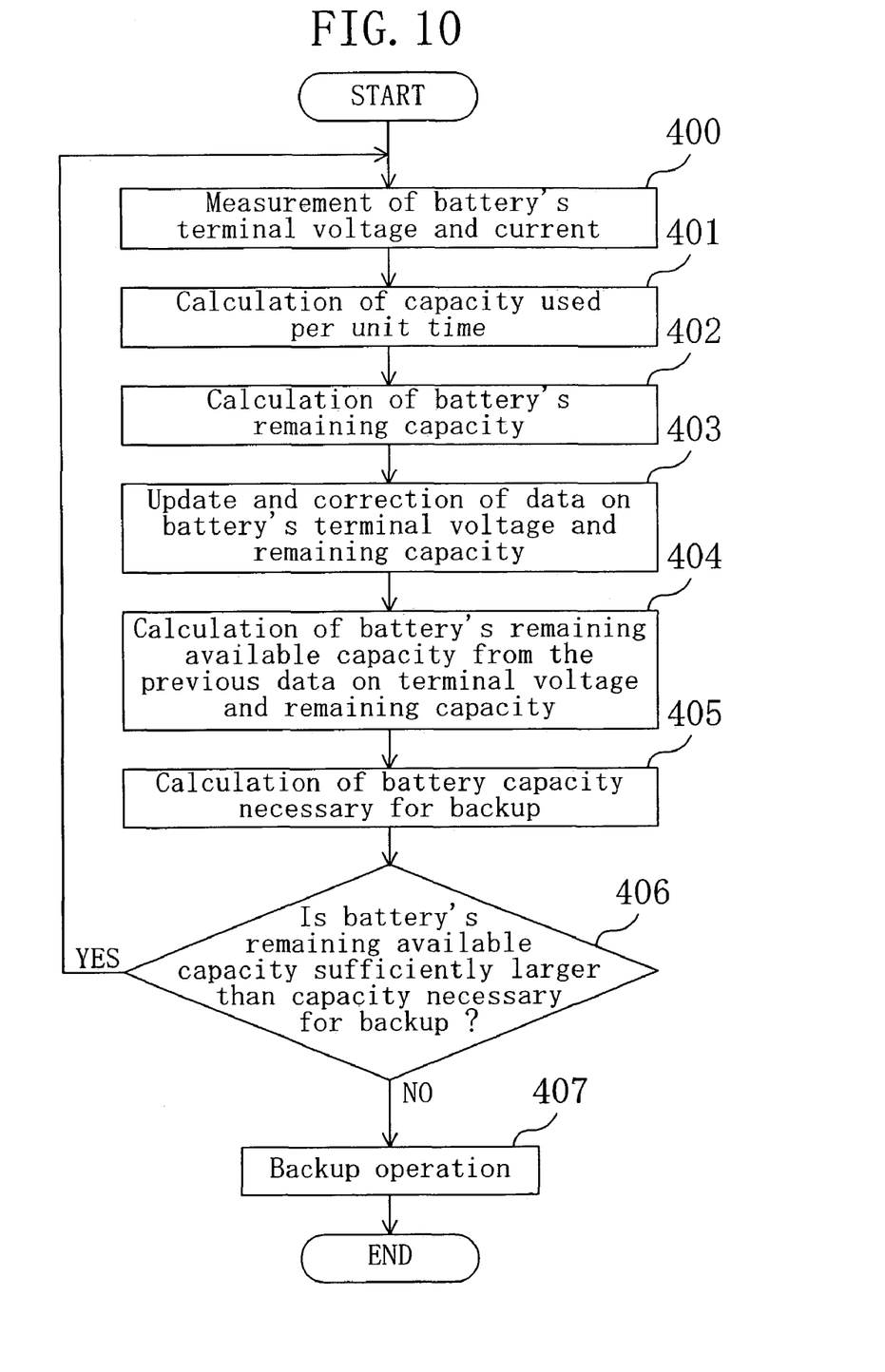
FIG. 10 is a flow chart illustrating process steps performed in the control unit when a user-data backup process is carried out in the cellular mobile phone shown in FIG. 1.

FIG. 10 is a flow chart illustrating process steps performed in the control unit 4 when a user-data backup process is carried out in the cellular mobile phone 1 shown in FIG. 1. The reference numerals 400 through 404 shown in FIG. 10 denote steps which correspond to Steps 100 through 104 shown in FIG. 5. The reference numeral 405 denotes the step of calculating battery capacity Qbackup (=Ibackup×Tbackup) needed to make a backup of user data. In this step, current Ibackup and time Tbackup required to make the backup are calculated by considering which one of the internal memory 4a, home memory 14 and external memory 8 is used as a memory into which the backup of the user data is stored, and the wave intensity at the time of the calculation. The magnitude of current necessary in each backup mode with respect to the wave intensity is as shown in FIG. 7.

The reference numeral 406 shown in FIG. 10 denotes the step of making a determination as to whether the remaining available capacity Q*(n) of the battery 6 is sufficiently larger than the capacity Qbackup required for making the backup. The reference numeral 407 indicates the step of performing the user-data backup process when the remaining available capacity Q*(n) of the battery 6 becomes substantially equal to the capacity Qbackup necessary to make the backup. If, in Step 406, the remaining available capacity Q*(n) is determined to be sufficiently large, the backup process is deferred for a return to Step 400, and then the operations in Steps 400 through 406 are repeated. In this manner, the control unit 4 controls frequency of the user-data backup process in order to reduce it in accordance with the magnitude of the remaining available capacity Q*(n) of the battery 6, so that the consumption of the battery 6 is controlled.

Figure 11:
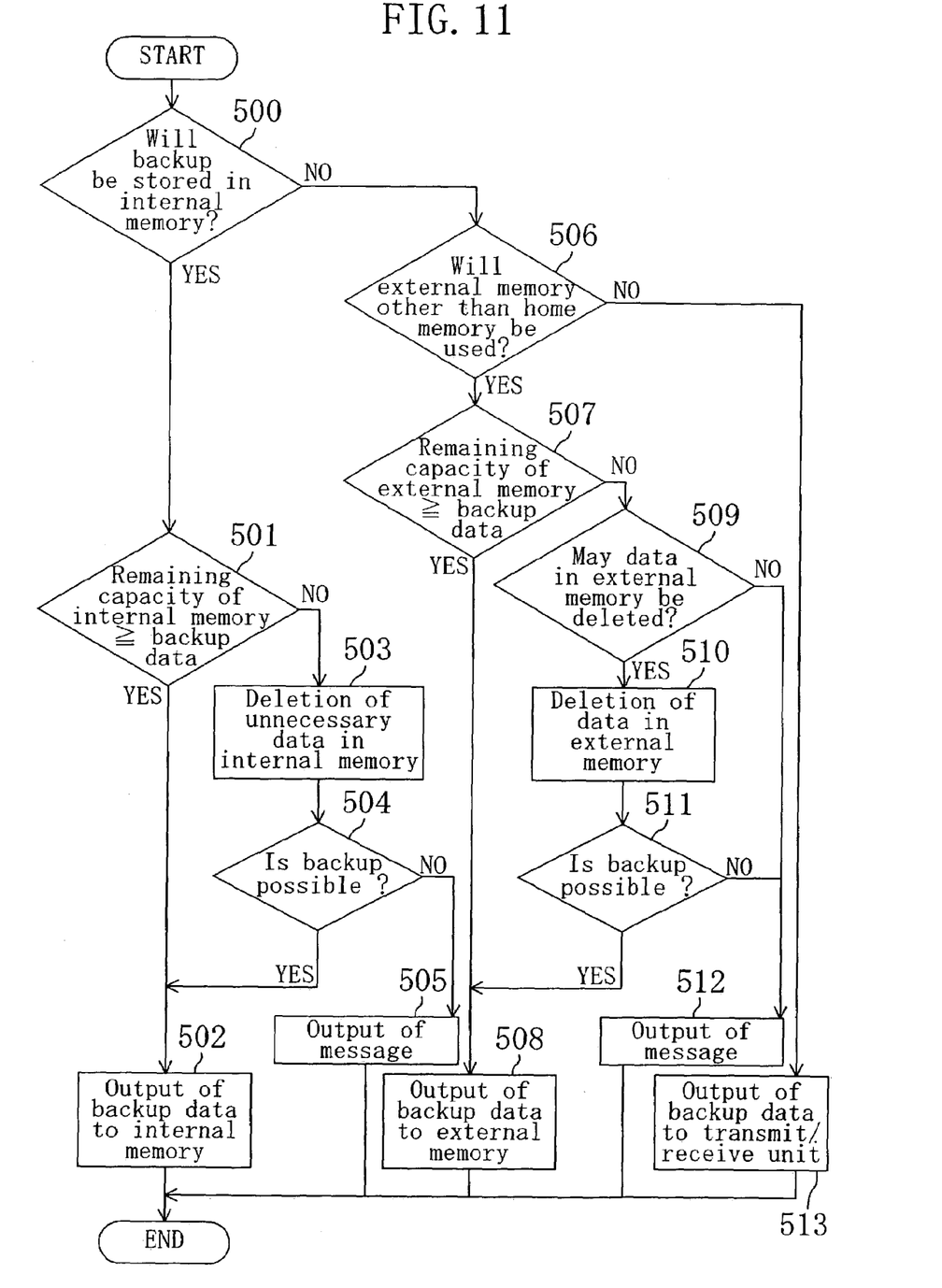
FIG. 11 is a flow chart illustrating the details of the backup process step shown in FIG. 10.

FIG. 11 is a flow chart illustrating the details of Step 407 of the backup process in FIG. 10. The reference numeral 500 shown in FIG. 11 represents the step of determining which one of the internal memory 4a, home memory 14 and external memory 8 is used as a memory in which the backup is stored. The reference numeral 501 denotes a step in which when it has been determined in Step 500 that the backup is stored in the internal memory 4a, a determination is made as to whether the remaining capacity of the internal memory 4a is larger than the capacity of the user data (backup data) to be backed up. The reference numeral 502 indicates a step in which when the determination has been made in Step 501 that the remaining capacity of the internal memory 4a exceeds the backup data capacity, the backup data is outputted to the internal memory 4a. The reference numeral 503 refers to a step in which when it has been determined in Step 501 that the remaining capacity of the internal memory 4a is smaller than the capacity of the backup data, unnecessary data in the internal memory 4a is deleted. The process of deleting the unnecessary data in the internal memory 4a will be described later. The reference numeral 504 represents the step of determining whether the backup becomes possible. If it has been determined that the backup is able to be made, the backup data is outputted to the internal memory 4a in Step 502. The reference numeral 505 denotes a step in which when the determination has been made in Step 504 that the backup is unable to be made, a message which indicates that the backup is not possible is outputted to the display portion 5.

The reference numeral 506 shown in FIG. 11 denotes a step in which in the case where the determination has been made in Step 500 that the backup is not retained in the internal memory 4a, it is determined whether the home memory 14 or the external memory 8 is used as a memory in which the backup is stored. The reference numeral 507 represents a step in which when it has been determined in Step 506 that the backup is stored in the external memory 8, whether the remaining capacity of the external memory 8 is larger than the capacity of the backup data is determined. The reference numeral 508 denotes a step in which when it has been determined in Step 507 that the remaining capacity of the external memory 8 exceeds the backup data capacity, the backup data is outputted to the external memory 8. The reference numeral 509 refers to a step in which in the case where the determination has been made in Step 506 that the remaining capacity of the external memory 8 is smaller than the backup data capacity, it is determined whether data in the external memory 8 may be deleted. The reference numeral 510 denotes a step in which when it has been decided in Step 509 that the data in the external memory 8 may be deleted, such data in the external memory 8 is deleted. The reference numeral 511 indicates the step of determining whether the backup becomes possible. If it has been decided that the backup is able to be made, the backup data is outputted to the external memory 8 in Step 508. The reference numeral 512 refers to a step in which in the case where it has been determined in Step 509 that the data in the external memory 8 should not be deleted, or in the case where it has been determined in Step 511 that the backup is not possible, a message which indicates that the backup cannot be made is outputted to the display unit 5. The reference numeral 513 denotes a step in which when the determination has been made in Step 506 that the backup is stored in the home memory 14, the backup data is outputted to the transmit/receive unit 3. The backup data outputted to the transmit/receive unit 3 is transferred to and retained in the home memory 14.

Figure 12:
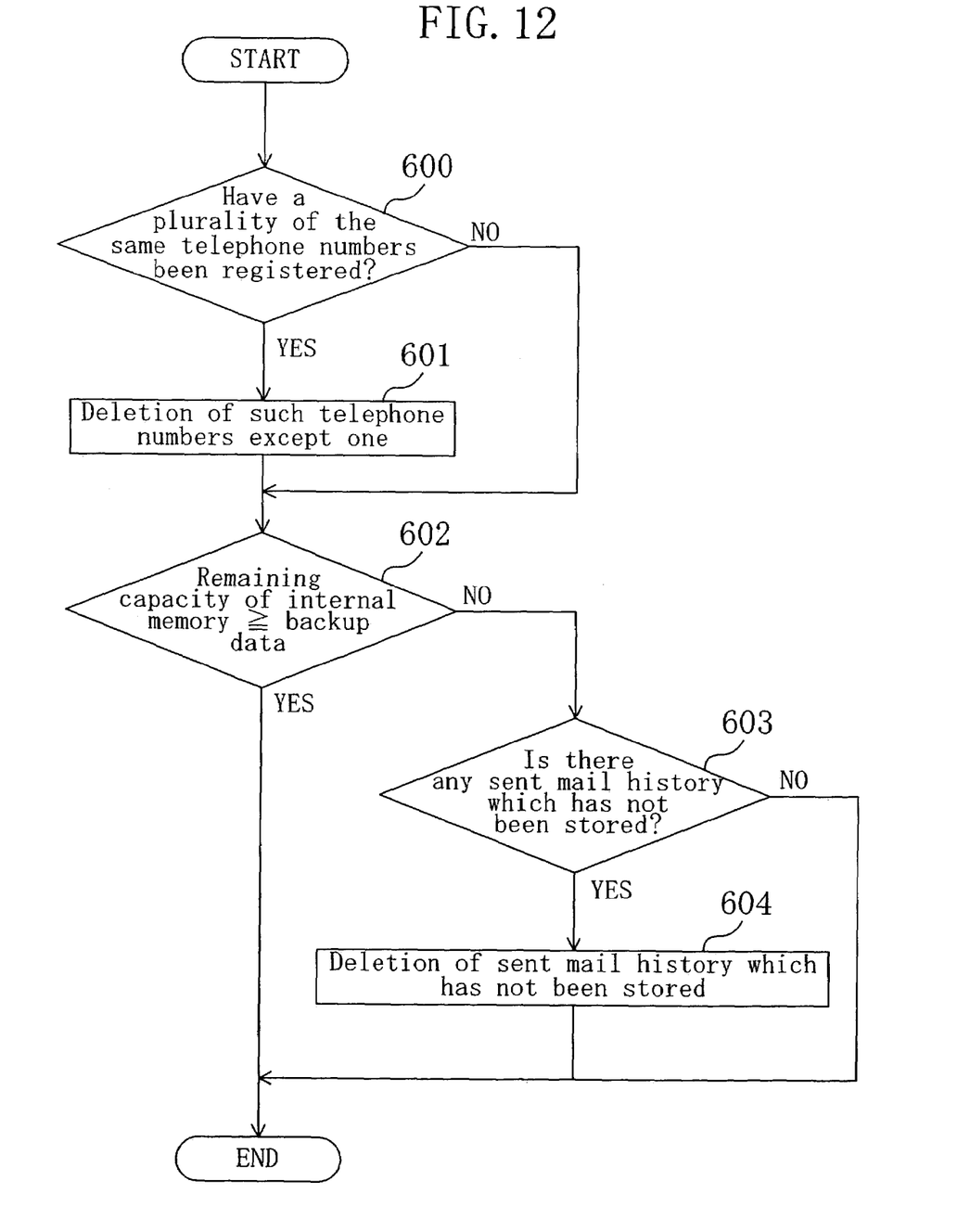
FIG. 12 is a flow chart illustrating the details of the step, shown in FIG. 11, of deleting unnecessary data in an internal memory.

FIG. 12 is a flow chart illustrating the details of Step 503, the unnecessary-data deleting step, shown in FIG. 11. In FIG. 12, the reference numeral 600 denotes the step of determining whether a plurality of the same telephone numbers have been registered. The reference numeral 601 denotes a step in which when it has been determined in Step 600 that the same telephone numbers have been registered, all such numbers except one are deleted. The reference numeral 602 denotes the step of making a determination as to whether the remaining capacity of the internal memory 4a is larger than the capacity of the backup data. If it has been determined in Step 602 that the remaining capacity of the internal memory 4a is greater than the capacity of the backup data, the process of deleting the unnecessary data in the internal memory 4a is ended. The reference numeral 603 denotes a step in which when the determination has been made in Step 602 that the remaining capacity of the internal memory 4a is smaller than the capacity of the backup data, it is determined whether the history list of sent mail contains a mail message whose history has not been stored. The reference numeral 604 represents a step in which in the case where it has been determined in Step 603 that the sent-mail history list includes a mail message whose history has not been stored, the history of such sent mail message is deleted. This step allows the unnecessary data to be deleted in the internal memory 4a. If it has been determined in Step 603 that there is no sent mail message whose history has not been stored, the process of deleting the unnecessary data is ended. As described above, in the process steps shown in FIG. 12, if the remaining capacity of the internal memory 4a is insufficient, the unnecessary data in the user data is found and deleted, such that the memory remaining capacity required to make the backup can be obtained.

In place of the cellular mobile phone 1 shown in FIG. 1, the radio base station 11 shown in FIG. 2 can also perform the above-described backup determination process.

Figure 13:
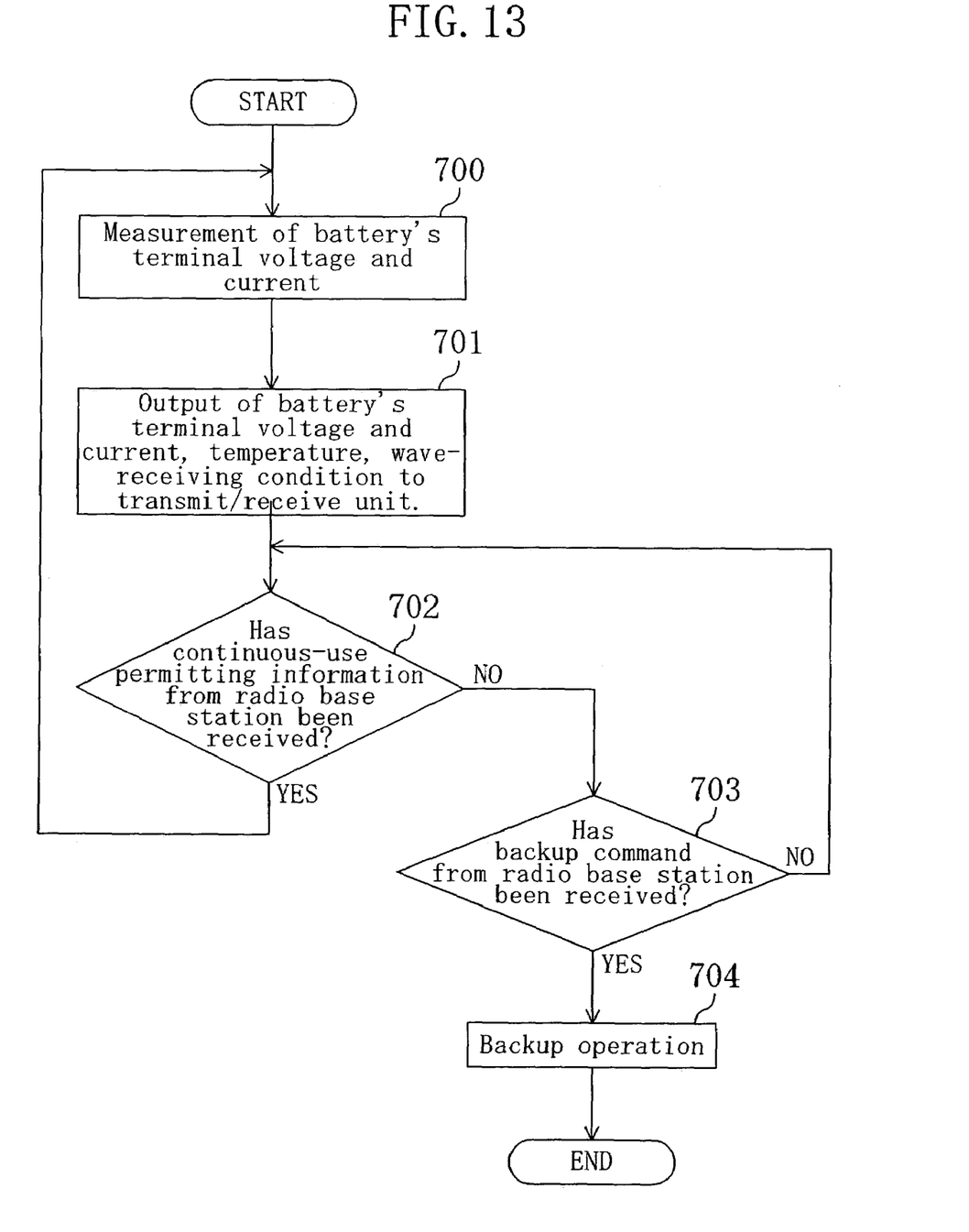
FIG. 13 is a flow chart illustrating process steps performed in the control unit of the cellular mobile phone when the radio base station shown in FIG. 2 performs a user-data backup determination process.

FIG. 13 is a flow chart illustrating process steps performed in the control unit 4 of the portable cellular phone 1 in a case where the radio base station 11 shown in FIG. 2 performs a user-data backup determination process. The reference numeral 700 in FIG. 13 denotes the step of measuring the terminal voltage V(n) and current I(n) of the battery 6. The reference numeral 701 denotes a step in which the measured terminal voltage V(n) and current I(n) of the battery 6, a temperature detected by the temperature detector 7, and the state of radio waves received by the cellular mobile phone 1 are outputted to the transmit/receive unit 3, thereby providing notification thereof to the radio base station 11. The reference numeral 702 denotes the step of determining whether the transmit/receive portion 3 has received "continuous-use permitting information" transmitted by the radio base station 11. If it has been determined in Step 702 that the continuous-use permitting information has been received, the process returns to Step 700, and then the operations in Steps 700 through 702 are repeated. The reference numeral 703 denotes a step in which in the case where it has been determined in Step 702 that the continuous-use permitting information has not been received, a determination is made as to whether the transmitter-receiver 3 has received a "backup command" sent from the radio base station 11. If the determination has been made in Step 703 that the backup command has not been received, the process returns to Step 702. The reference numeral 704 indicates a step in which when it has been determined in Step 703 that the backup command has been received, backup operation is performed. The details of the backup operation are as described in FIGS. 11 and 12.

Figure 14:
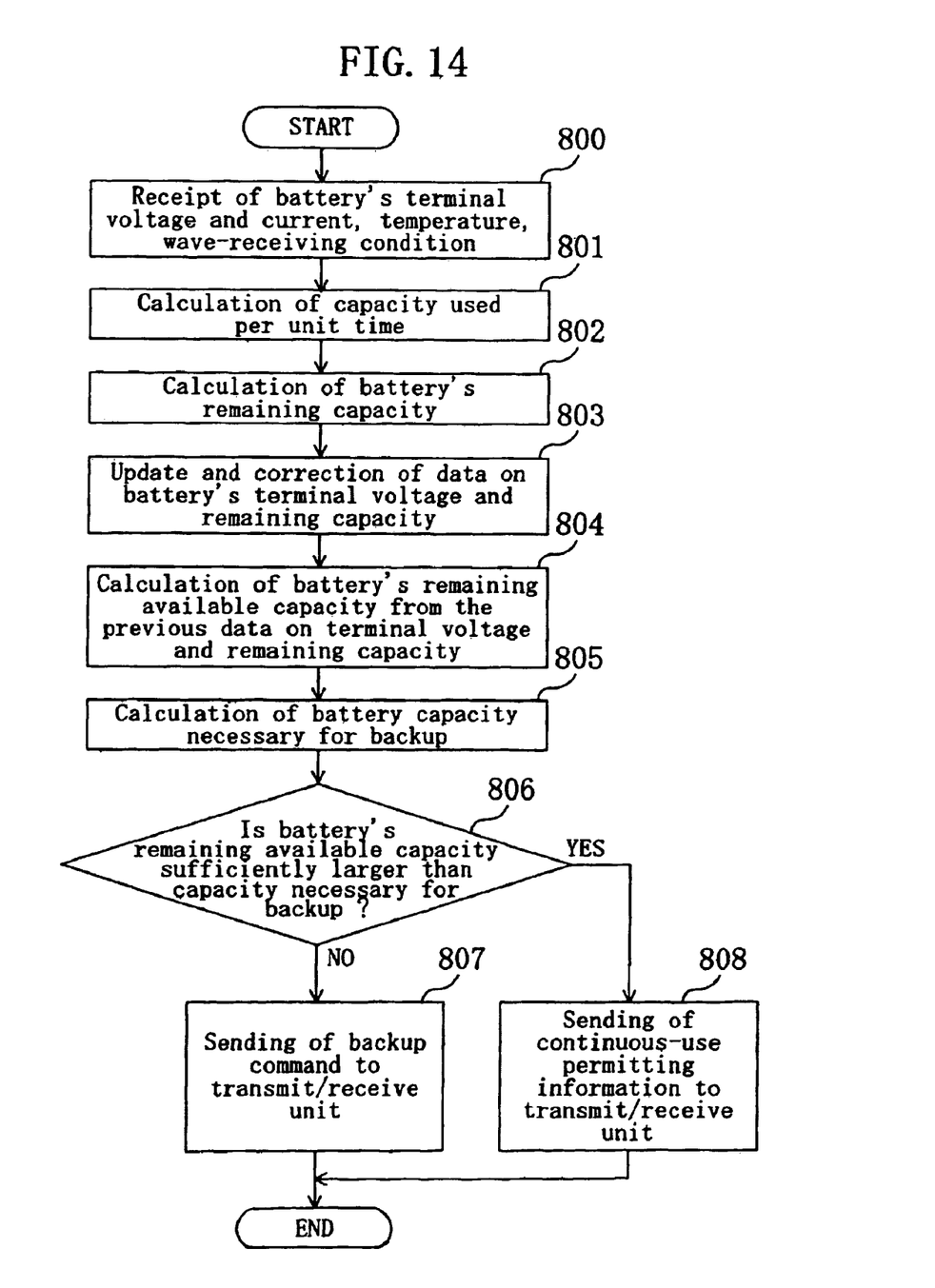
FIG. 14 is a flow chart illustrating process steps performed in the radio base station shown in FIG. 2 when the radio base station performs the user-data backup determination process.

FIG. 14 is a flow chart illustrating process steps performed in the radio base station 11 shown in FIG. 2 when the radio base station 11 performs the user-data backup determination process. The reference numerals 800 through 804 shown in FIG. 14 indicate steps which correspond to Steps 300 through 304 shown in FIG. 9. Data that indicates the remaining capacity Q of the battery 6 in terms of the terminal voltage V of the battery 6 is recorded in the home memory 14. The reference numerals 805 and 806 shown in FIG. 14 refer to steps which correspond to Steps 405 and 406 shown in FIG. 10. The reference numeral 807 shown in FIG. 14 denotes a step in which when the remaining available capacity $Q^*(n)$ of the battery 6 becomes substantially equal to the capacity Qbackup necessary to make the backup, the backup command is transmitted to the transmitter-receiver 3 of the cellular mobile phone 1. The reference numeral 808 denotes a step in which when it has been determined in Step 806 that the remaining available capacity $Q^*(n)$ is sufficiently large, the continuous-use permitting information is transmitted to the transmit/receive unit 3 of the cellular phone 1 so that the backup operation is delayed.

It should be noted that in the process step of deleting the unnecessary data in the internal memory 4a, although the registered same telephone numbers and the sent-mail history that has not been stored are deleted in this order in FIG. 12, this order may be changed in accordance with user settings.

What is claimed is:

1. A cellular mobile phone which is driven by a battery, the phone comprising:
   a control unit for measuring the terminal voltage and current of the battery;
   a transmit/receive unit for providing an external device with notification of the measured terminal voltage and current, and receiving notification of available time for the cellular mobile phone, wherein the external device has calculated the available time while updating, when necessary, data which indicates remaining capacity of the battery in terms of the terminal voltage of the battery;
   a display unit for displaying thereon the notified available time; and
   a temperature detection unit for detecting temperature near the battery,
   wherein the transmit/receive unit also functions to notify the external device of the detected temperature so that the data that indicates the remaining capacity is corrected by the external device in accordance with the detected temperature.

2. A cellular mobile phone which is driven by a battery, the phone comprising:
   a control unit for measuring the terminal voltage and current of the battery;
   a transmit/receive unit for providing an external device with notification of the measured terminal voltage and current, and receiving notification of available time for the cellular mobile phone, wherein the external device has calculated the available time while updating, when necessary, data which indicates remaining capacity of the battery in terms of the terminal voltage of the battery; and
   a display unit for displaying thereon the notified available time,
   wherein the transmit/receive unit also functions to notify the external device of a radio-wave receiving condition in the cellular mobile phone so that the available time for the cellular mobile phone is calculated by the external device based on the magnitude of the battery's current which is required in accordance with the radio-wave receiving condition in the cellular mobile phone.

3. A cellular mobile phone which is driven by a battery, the phone comprising:
   a control unit for measuring the terminal voltage and current of the battery;
   a transmit/receive unit for providing an external device with notification of the measured terminal voltage and current, and receiving notification of available time for the cellular mobile phone, wherein the external device has calculated the available time while updating, when necessary, data which indicates remaining capacity of the battery in terms of the terminal voltage of the battery; and
   a display unit for displaying thereon the notified available time,
   wherein the control unit exercises control in order to reduce, in accordance with the magnitude of remaining available capacity of the battery, the number of times a process for making a backup of user data is performed, and
   wherein the control unit functions to delay the backup process if the remaining available capacity of the battery is sufficiently larger than necessary capacity for the backup process.

4. A cellular mobile phone which is driven by a battery, the phone comprising:
   a control unit for measuring the terminal voltage and current of the battery;
   a transmit/receive unit for providing an external device with notification of the measured terminal voltage and current, and receiving notification of available time for the cellular mobile phone, wherein the external device has calculated the available time while updating, when necessary, data which indicates remaining capacity of the battery in terms of the terminal voltage of the battery; and
   a display unit for displaying thereon the notified available time,
   wherein the control unit exercises control in order to reduce, in accordance with the magnitude of remaining available capacity of the battery, the number of times a process for making a backup of user data is performed, and
   wherein the phone is structured in such a manner that a memory in which the backup of the user data is stored may be selected from among an internal memory of the cellular mobile phone, a home memory for managing subscriber information, and an external memory other than the home memory.

5. A cellular mobile phone which is driven by a battery, the phone comprising:
   a control unit for measuring the terminal voltage and current of the battery;
   a transmit/receive unit for providing an external device with notification of the measured terminal voltage and current, and receiving notification of available time for the cellular mobile phone, wherein the external device has calculated the available time while updating, when necessary, data which indicates remaining capacity of the battery in terms of the terminal voltage of the battery; and
   a display unit for displaying thereon the notified available time, wherein the control unit exercises control in order to reduce, in accordance with the magnitude of remaining available capacity of the battery, the number of times a process for making a backup of user data is performed, and wherein the control unit also functions to find and delete unnecessary data in the user data if remaining capacity of a memory in which the backup of the user data is to be stored is insufficient.

6. A semiconductor integrated circuit for a cellular mobile phone which is driven by a battery, the circuit comprising:

a control unit for measuring the terminal voltage and current of the battery;

a transmit/receive unit for providing an external device with notification of the measured terminal voltage and current, and receiving notification of available time for the cellular mobile phone, wherein the external device has calculated the available time while updating, when necessary, data which indicates remaining capacity of the battery in terms of the terminal voltage of the battery; and means for having the notified available time displayed, wherein the control unit exercises control in order to reduce, in accordance with the magnitude of remaining available capacity of the battery, the number of times a process for making a backup of user data is performed.

* * * * *